United States Patent
Frackelton et al.

(10) Patent No.: US 11,061,077 B2
(45) Date of Patent: Jul. 13, 2021

(54) PARALLEL TRIGGER MODEL FOR TEST AND MEASUREMENT INSTRUMENTS

(71) Applicant: Keithley Instruments, LLC, Solon, OH (US)

(72) Inventors: Brian P. Frackelton, Macedonia, OH (US); George J. Polly, Brecksville, OH (US)

(73) Assignee: Keithley Instruments, LLC, Solon, OH (US)

( * ) Notice: Subject to any disclaimer, the term of this patent is extended or adjusted under 35 U.S.C. 154(b) by 623 days.

(21) Appl. No.: 15/859,322

(22) Filed: Dec. 29, 2017

(65) Prior Publication Data

US 2018/0259562 A1 Sep. 13, 2018

Related U.S. Application Data

(60) Provisional application No. 62/469,445, filed on Mar. 9, 2017.

(51) Int. Cl.
*G01R 31/50* (2020.01)
*G01R 13/02* (2006.01)
*G01R 13/32* (2006.01)

(52) U.S. Cl.
CPC ......... *G01R 31/50* (2020.01); *G01R 13/0254* (2013.01); *G01R 13/32* (2013.01)

(58) Field of Classification Search
CPC ...................................... G01R 31/50
USPC ....................................... 702/108
See application file for complete search history.

(56) References Cited

U.S. PATENT DOCUMENTS

| | | | | |
|---|---|---|---|---|
| 6,542,841 B1* | 4/2003 | Snyder | ............... | H04B 10/0795 372/26 |
| 6,697,750 B1* | 2/2004 | Coin | ............... | H04B 10/07 702/106 |
| 2007/0180339 A1* | 8/2007 | Connally | ......... | G01R 31/31718 714/724 |
| 2008/0129313 A1* | 6/2008 | Iwamoto | ......... | G01R 31/31907 324/555 |
| 2009/0281759 A1* | 11/2009 | Cake | ................. | G01R 13/0254 702/123 |
| 2009/0295404 A1* | 12/2009 | Matsumoto | ...... | G01R 31/31937 324/555 |
| 2012/0313655 A1* | 12/2012 | Bald | ................ | G01R 31/50 324/750.01 |
| 2013/0262018 A1* | 10/2013 | Studnicki | ........... | G01R 31/3008 702/117 |
| 2014/0046613 A1* | 2/2014 | Roberts, Jr. | ........ | G01R 31/2601 702/108 |
| 2015/0055131 A1* | 2/2015 | Ono | ................... | G01M 11/0207 356/244 |

\* cited by examiner

*Primary Examiner* — Ricky Go
(74) *Attorney, Agent, or Firm* — Miller Nash Graham & Dunn; Andrew J. Harrington (57) ABSTRACT

A test and measurement instrument for performing multiple operations, including a port to receive a signal from a device under test; and a processor. The processor configured to, based on a parallel trigger model, execute a first process associated with first functionality of the test and measurement instrument, and execute a second process on the signal from the device under test, the second process associated with second functionality of the test and measurement instrument. The second process commencing prior to completion of the first process.

19 Claims, 4 Drawing Sheets

PARALLEL TRIGGER MODEL FOR TEST AND MEASUREMENT INSTRUMENTS

PRIORITY

This disclosure claims benefit of U.S. Provisional Application No. 62/469,445, titled "PARALLEL TRIGGER MODEL," filed on Mar. 9, 2017, which is incorporated herein by reference in its entirety.

FIELD OF THE INVENTION

This disclosure is related to the area of test and measurement, and in particular, to parallel triggering in test and measurement.

BACKGROUND

Some test and measurement instruments include multiple functional components. For example, dataloggers are used to switch between channels and collect measurements of a characteristic of a signal on each channel. That is, dataloggers include both switching functional components as well as a measurement functional components. In a datalogger, a scan is configured to walk through a series of channels on a device under test (DUT) and take a measurement on each channel. This scan is normally repeated numerous times and can run for hours, days, or even months. Source and measurement units include both a source component and a measurement component. Different sources may be supplied, such as a voltage source or a current source, and the measurement component is able to measure characteristics of a signal (e.g., voltage, current, frequency amplitude, etc.).

In test and measurement instruments that have multiple functional components, a user is able to set up and run a trigger process to instruct the test and measurement instrument when to perform each functional component. In current test and measurement instruments, this process is performed sequentially. That is, neither of the functional components can be triggered in parallel, but rather must be triggered sequentially. For example, in a datalogger, switching between channels is performed prior to a measurement being configured and performed. This results in a loss of performance of the test and measurement instrument as the trigger process takes longer to perform since each function must run sequentially.

Examples in the disclosure address these and other issues.

BRIEF DESCRIPTION OF THE DRAWINGS

Aspects, features and advantages of embodiments of the present disclosure will become apparent from the following description in reference to the appended drawings in which:

FIG. 2 according to various embodiments of the disclosure.

DESCRIPTION

Figure 1:
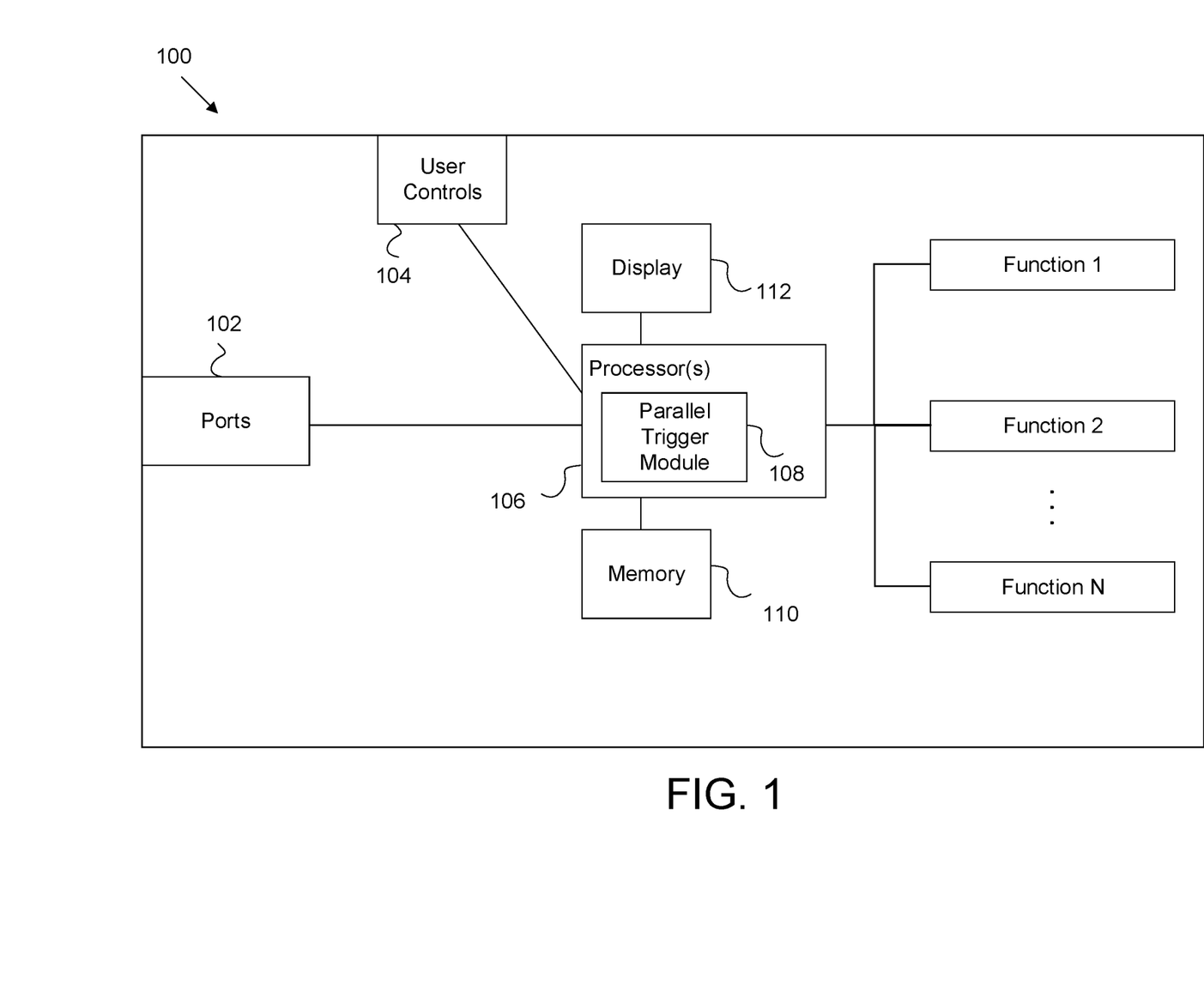
FIG. 1 is a schematic diagram of an example test and measurement system according to various embodiments of the disclosure.
Figure 3:
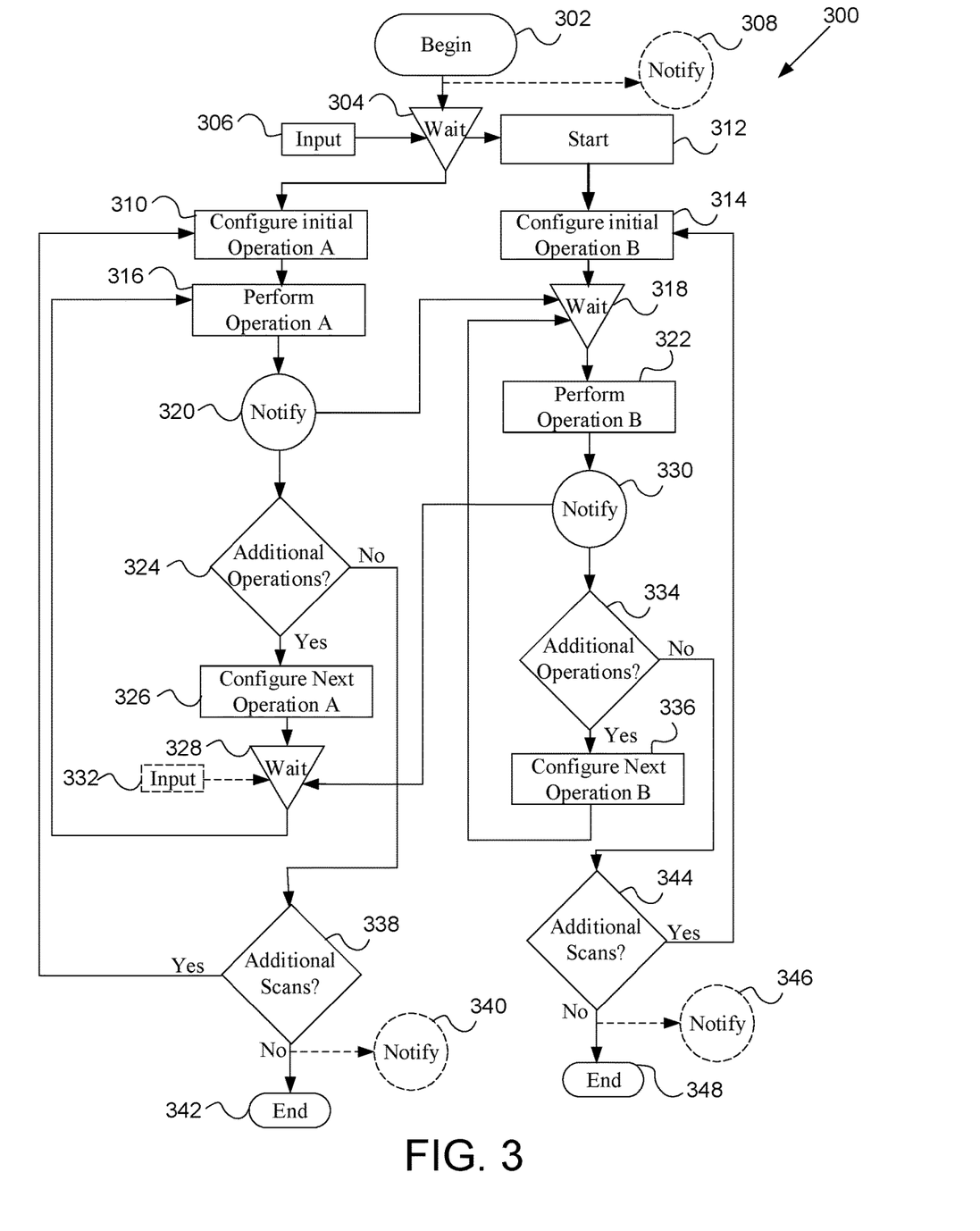
FIG. 3 is a flowchart of an example parallel trigger model according to various embodiments of the disclosure.
Figure 4:
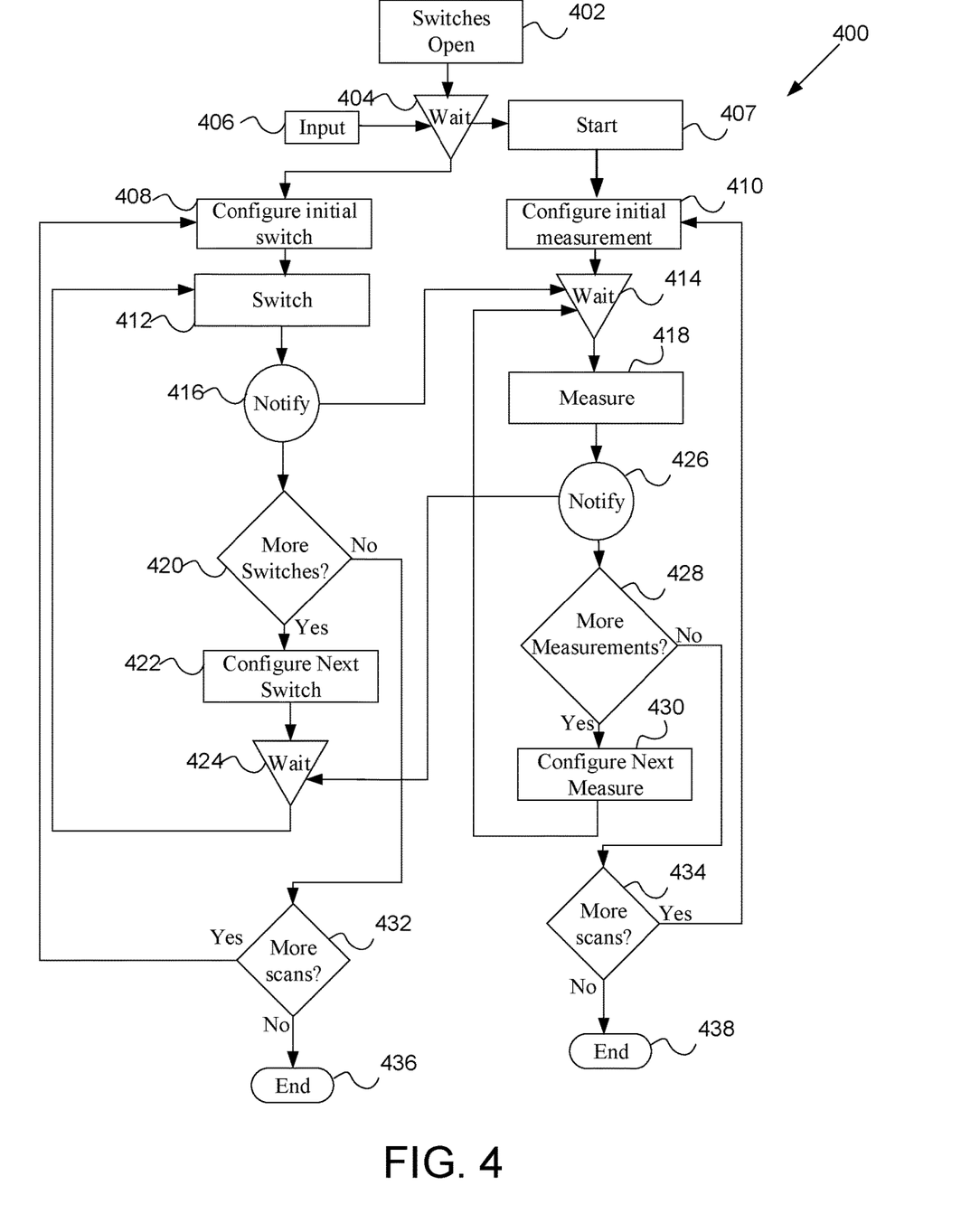
FIG. 4 is a flowchart of another example parallel trigger model according to various embodiments of the disclosure.

Disclosed herein is a test and measurement instrument configured to perform multiple functions simultaneously. The test and measurement instrument includes an input to receive a parallel trigger model that coordinates operations of the multiple functions to enable the multiple functions to be performed simultaneously. One or more processors that have control over components associated with the operations of the multiple functions then execute the parallel trigger model, which allows the test and measurement instrument to perform the multiple functions, or aspects thereof, in concert. The multiple functions may be performed with complete independence from each other or may be performed with various operations of the multiple functions dependent on each other. By enabling operations of the multiple functions to be performed concurrently, functionality of the test and measurement instrument that would have previously lied dormant waiting for other functionality to finish is able to be utilized in parallel. This increases efficiency of the test and measurement instrument and reduces the amount of time to complete testing FIG. 1 is a schematic diagram of an example test and measurement system 100 that performs more than one function. Some examples of such test and measurement systems include a datalogger, a data acquisition unit, or a source measure unit (SMU). That is, the test and measurement system may include multiple components of function (e.g., Functions 1-N, discussed in greater detail below). System 100 includes ports 102, also referred to herein as channels, which may be any electrical, optical, and/or wireless ports configured to receive a signal for scanning and/or for communicating alerts to a user over a network. Ports 102 may include receivers, transmitters, and/or transceivers. Ports 102 are coupled to one or more processor(s) 106, which may be implemented as a processor, an application specific integrated circuit (ASIC), a digital signal processor (DSP), a field programmable gate array (FPGA), virtual processor, etc., or any combination thereof. Processor(s) 106 are configured to execute instructions from memory 110 and may perform any methods and/or associated steps indicated by the instructions. Processor 106 may include a parallel trigger module 108, which may be configured to provide a development environment that enables a user to develop/assemble a parallel trigger model. In addition, or alternatively, parallel trigger module 108 can include and an execution environment that enables operations defined in a parallel trigger model to be carried out, or executed. Such a parallel trigger model can define a process for performing various operations associated with each of Functions 1-N, or a subset of those functions, in parallel. An example of such a parallel trigger model is depicted in FIGS. 3 and 4, discussed in more detail below. In some embodiments, the parallel trigger module 108 may be implemented via instructions that are in whole or in part contained within memory 110. Memory 110 may be implemented as processor cache, random access memory (RAM), read only memory (ROM), solid state memory, hard disk drive(s), any other computer-readable storage media, or any combination thereof. Memory 110 acts as a medium for storing data, computer program products, and other instructions, and providing such data/products/instructions to the processor 106 for execution, computation, or other processing as needed.

The multiple functions are depicted by Functions 1-N. Each of these functions would include various components (not depicted) that combine to perform the functionality associated with the respective function. These components may be embodied in hardware, software, or any combination thereof. While the functions are depicted as being disjoint, this is merely for clarity of depiction and it will be appreciated that various ones of the functions may share components for performing the functionality associated with the function. Examples of such functions are source functionality and measurement functionality of an SMU, switching functionality and measurement functionality of a data logger, etc.

User controls 104 are communicatively coupled to the processor 106. User controls 104 may include a keyboard, mouse, trackball, touchscreen, and/or any other controls employable by a user to interact with processor 106 and/or alarm limit module 108 (e.g., via a graphical user interface on a display 112). Display 112 may be a digital display (e.g., LCD, LED, etc.), a cathode ray tube based display, or any other monitor to display output of system 100) to an end user. It will be appreciated that, while display 112 is depicted as being integrated with the test and measurement system, the display could be a separate display coupled with the test and measurement instrument via any sort of wired and/or wireless connection.

Figure 2:
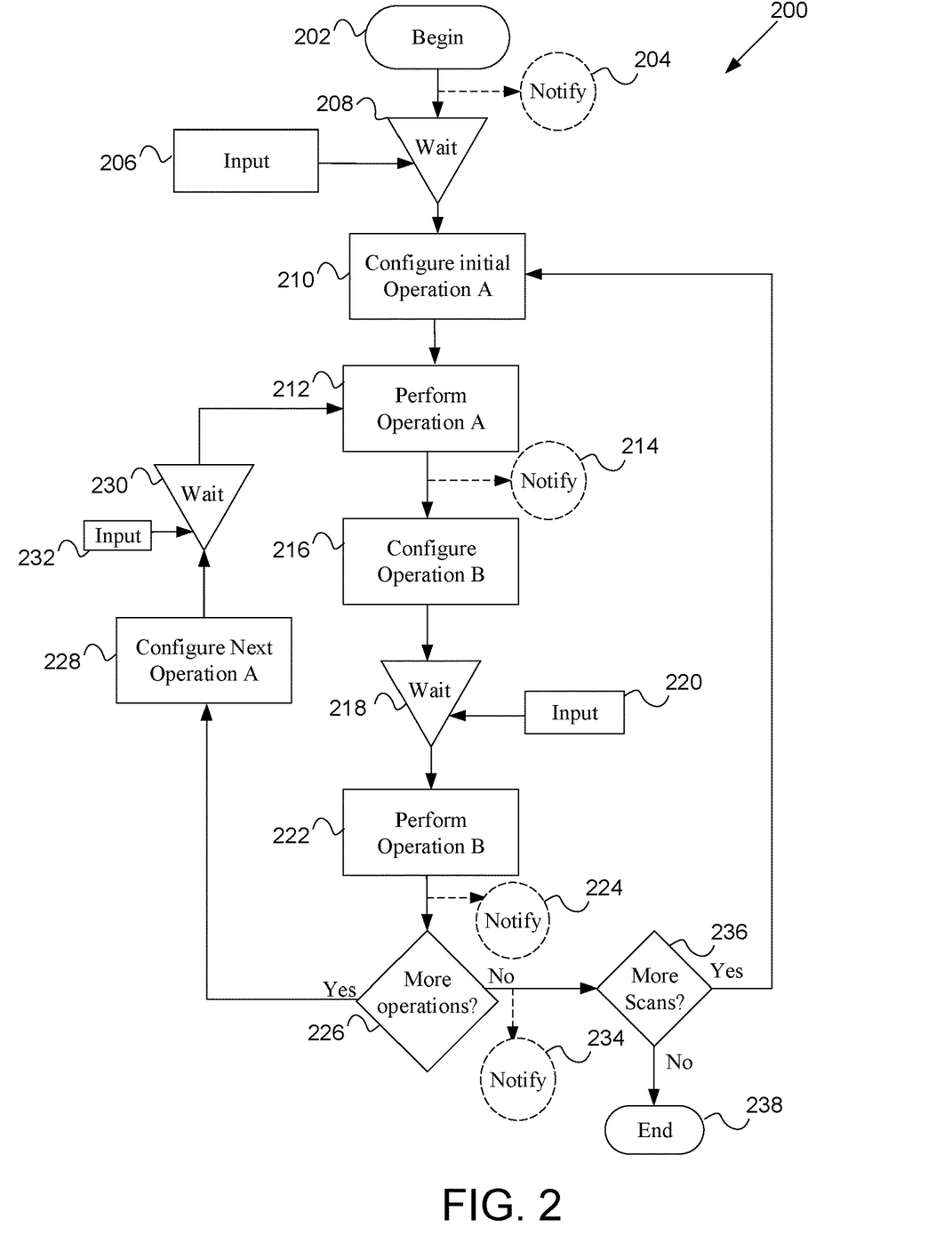

FIG. 2 illustrates an example of a conventional flow chart of a sequential scan trigger process for performing multiple operations on a test and measurement instrument, each operation dependent on the other. Conventional trigger models allow a user to set up a trigger with multiple functions in a sequential manner only. For example, the process depicted in the flow chart of FIG. 2 may be used in a datalogger to perform a scan of a device under test by walking through each channel and performing a measurement. For these triggers, a first operation is configured and performed. Once the first operation is complete, a second operation is configured and then performed. This is repeated until no further scans are required.

The process 200 begins at start 202. Using a datalogger as an example, at start 202, all the switches in the datalogger are open. In some embodiments, a notification 204 may be output at this point and a user interface notification may be generated to alert a user all the switches are open and the process 200 is ready to start. An input 206 is provided to a wait block 208. The input 206 may be a timer or any other type of input that would signal the start of the scan. For example, the input 206 may be an input from a user received at the user controls 104.

When the input 206 is received to signal the next operation, initial operation A is configured 210, which is the beginning of the list of various configurations of operation A, as discussed in more detail below. The number of operations performed for A and B is dependent on the type of operations to be performed. Once configured, operation A is performed 212 and an optional notification may be generated 214. Operation B is then configured 216. In the example of the datalogger, the measurement for measuring the channel switched by operation A is configured. The process waits 218 until another input 220 is received. Again, the input 220 may be a timer or any other signal to indicate operation B should be performed. Operation B is then performed 222. An optional notification may be generated 224. After Operation B is performed 222, the process 200 determines 226 if there are additional operations to be performed. If yes, the next operation A is configured 228. For example, the switches are configured to the next configuration to perform a measurement of the next channel in the scan. The system waits 230 until another input 232 is received, and operation A is performed in the next configuration.

The process loops through performing and configuring operations A and B until the scan is complete. For example, with a datalogger, the operations are performed until all the channels have been measured. Once all the operations are performed, then a notification may be generated 234 and the process 200 determines 236 if more scans are to be performed. If no, then the scan ends 234. If yes, the system loops back to configuring 210 the initial operation A, and begins looping through the process again until the scan is complete.

Because operation A is configured and performed before operation B is configured and performed in the sequential trigger process, the performance of the test and measurement instrument is slower. However, embodiments of the disclosure include a test and measurement system that allows a user to configure a parallel trigger process and perform multiple functions in parallel. The parallel trigger process that allows operations A and B to be configured and performed in parallel increases the system performance. In some embodiments, the operations may be performed independently. That is, both operations A and B may run in parallel independent of the other operations. In some embodiments, complete independence between operations A and B is not required and notify and wait functions may be used to synchronize the parallel paths. For example, one path can wait on a notification from the other path before moving forward, or vice versa.

FIG. 3 illustrates an example parallel trigger model 300 that coordinates the performance of multiple functions in parallel. The model 300 may include multiple scans, each scan including multiple operation configurations. As discussed in more detail below, at the end of each scan, the operations can be reset to their initial configurations and processed through again until all desired scans have been performed.

Model 300 of FIG. 3 may be configured by a user, e.g., via a development environment, based on the desired testing of a device under test. The parallel processes can be created, in some embodiments, in much the same way as a flowchart. As depicted, model 300 is developed from five fundamental building block types. The building blocks include a start block, a wait block, a branch block, an action block, and a notify block. The Start bock serves as a starting point for running a parallel process portion of the trigger model. As depicted, one path, or process, starts from the top (e.g., at Begin 302), which may be initiated by selecting model 300 for execution, and the start block begins one or more parallel paths, or processes, (e.g., Start 312). The wait block waits for an event to occur before the flow continues. A branch box branches when a condition has been satisfied. An Action block initiates an action in the instrument, such as a measurement, source, delay, set digital input/output, etc. Finally, the notify block notifies other equipment, processes, or components that an event has occurred. The parallel trigger model may be created, via the development environment mentioned above in reference to FIG. 1, using the user controls 104, or may be created by remote commands. Other blocks and trigger functions may also be provided, such as immediate, timer, and manual triggering. In the development environment, the user can select blocks and build a desired parallel trigger model, which can then be interpreted by, for example, an execution environment of parallel trigger module 108 of FIG. 1. Model 300, in FIG. 3, is an example process that may be built by a user. In FIG. 3, complete independence between operations A and B is not desired, so notify and wait blocks have been used to synchronize dependencies between the parallel processes.

In some embodiments the development environment, or an execution environment, may visually delineate blocks for a first path, or process, corresponding to operations of a first function, from blocks for a second path, or process, corresponding to operations of a second function. This could be accomplished, for example, by utilizing one color for blocks of the first path and a second color for blocks of the second path when displayed to a user (e.g., via display 112). The development environment enables the user to add blocks, rearrange blocks, and connect blocks to run the parallel process desired for the device under test.

In some embodiments, the parallel trigger module 108 may, via the execution environment, run the desired process and, if the process is unable to run for any reason, the parallel trigger module 108 can generate an alert to display on the display 112 of the errors in the parallel process. In some embodiments, blocks in the flowchart displayed on the display 112 may be visually delineated (e.g., via color) if an error is present (e.g., lack of a necessary dependency). Because trigger model resources can be shared between multiple paths, the parallel trigger model can be subject to the same process constraints as a sequential trigger model. That is, if two operations in the test and measurement instrument are incapable of operating in parallel because they utilize the same resources, then an independent parallel trigger model will not work for those operations. In such a scenario, the two operations are referred to herein as overlapping operations. The execution environment, or development environment, can identify these errors for the user to enable the user to adjust the parallel trigger model to rectify such an issue. Although FIG. 3 illustrates two parallel process paths, more than two parallel process paths may be set up by a user. That is, as long as the test and measurement instrument is configured to perform the desired functions, and the functions are capable of being performed simultaneously, the user may set up any number of parallel paths, as desired.

Further, if an action block is found in more than one path, the blocks can be highlighted as an error, as each function should have its own path in the parallel trigger model. That is, each path should be dedicated to a respective function, although each path may be synchronized with at least one other path using wait and notify blocks, if desired or necessary.

As mentioned above, FIG. 3 illustrates an example parallel trigger model 300 configured by a user. At begin 302, the test and measurement system is set at an initial setup and begins waiting 304 for an input 306. The test and measurement system may output a notification 308 to alert a user that execution of the parallel trigger model 300 has begun.

When the input 306 is received at the wait function 304, the test and measurement system configures 310 initial operation A and sends a message to start block 312 to then configure 314 initial operation B, in parallel. Operation A may be associated with a first function of a test and measurement instrument while operation B may be associated with a second function of the test and measurement instrument. Start block 312 is provided so that operation B may be started prior to actual performance of operation A, if desired. That is, both operation A and operation B paths may be started simultaneously or independently, depending on the desired parallel trigger model. When initial operation A is configured 312, then operation A is performed 316. After initial operation B is configured 312, the process proceeds to wait 318 until a notification 320 is received that operation A is performed 316. Notification 320 may be just to wait 318 or may also include a notification on a user interface as well.

When notification 320 is received at wait 318, operation B is performed 322. While operation B is performed 322, the process determines 324 if any additional operation A configurations remain. For example, a counter may be incremented or decremented to count the number of operations performed until a specified number of operations is reached. If additional operations remain, then the next operation A is configured 326 and the process then proceeds to wait 328. After operation B is performed 322, a notification is generated and sent 330 to wait 328. The notification may also include a notification on the user interface in some embodiments to alert a user that operation B has been performed.

When the wait 328 receives the notification 330 and an input 332, such as a timer or any other type of input, then the process returns to perform 316 operation A. After the notification is generated 330, the process determines 334 if any additional configurations remain for operation B. If so, then the next operation B is configured 336 and the process returns to wait 318 to receive a notification 320 that operation A is performed 316.

If there are no additional operation A configurations as determined in 324, then the process determines 338 if additional scans should be performed. If there are additional scans to be performed, the process returns to the initial configuration 312 of operation A to then process through each iteration of configurations for operation A on the next scan. If there are no more scans to be performed then a notification may be generated 340 that indicates the first path of the parallel trigger model has completed processing and the process ends 342.

Further, if there are no additional operation B configurations as determined in 334, then the process determines 344 if additional scans should be performed. If there are additional scans to be performed, the process returns to the initial configuration 314 of operation B to then process through each iteration of configurations for operation B. If there are no more scans to be performed then a notification may be generated 346 that indicates the second path of the parallel trigger model has completed processing and the process ends 348.

The example process 300 of FIG. 3 may be used in any test and measurement instrument that is performing operations associated with multiple functions of the test and measurement instrument. For example, the test and measurement instrument may be a datalogger, which includes a switching function, to switch between the different channels of a device under test, and a measurement function, to measure each channel. For ease, the operations associated with these two functions have been designated as operation A and operation B in FIG. 3. In a datalogger, switching between channels may be operation A and measuring may be operation B. As another example, the test and measurement instrument may be a source measure unit, which switches between various sources and then performs a measurement for each source. In such a device, switching sources may be operation A and measuring may be operation B. In some embodiments, both operation A and operation B may be measurement components, if the measurement components are able to operate independently of each other. The process 300 allows multiple functions to run in parallel to increase the test and measurement performance and may yield substantial throughput improvement. However, as mentioned above, the process 300 is not the only process that may be run by the test and measurement instrument. Using the user controls 104, a user may create a parallel trigger model as desired.

FIG. 4 illustrates an example parallel trigger model 400 for a datalogger. In this example, a user desires to scan channel 101 for voltage, channel 102 for resistance, and channel 103 for current for 5 scans. As such, in this example, the switching count is 3 and the scan count is 5. However, as readily understood by one of ordinary skill in the art, hundreds of channels may be scanned. The scan period may be a set number of scans or may also, or alternatively, be based on a time period. That is, the scan count may also be a timer. FIG. 4 illustrates the example parallel process 400 as input by the user and the functions of the test and measurement instrument are described below based on the received parallel process 400.

Turning to the process 400 in FIG. 4, initially, all the switches in the datalogger are open 402. The process waits 404 until an input 406 is received to begin the scan of the channels. For ease of discussion, all optional notifications and inputs have been removed from the process of FIG. 4. However, as shown in FIG. 3, multiple notifications may be generated throughout the process to notify a user of the status of the process and inputs may be received at the wait blocks prior to moving on to the next portion of the process.

When the input 406 is received, the parallel process is initiated with start block 407. Start block 407 kicks off the initial configuration 408 of the switch in parallel with the initial configuration of the measurement 410. The circuits are switched 412 to allow a voltage measurement of channel 101. After the initial measurement is configured 410, which is a voltage measurement configuration in this example, the process waits 414 until a notification 416 is generated to perform 418 the voltage measurement of a signal channel 101. The notification 416 may be generated after a settle time has elapsed. During the measurement 418, the process determines 420 whether there are additional circuit switches to switch to additional channels. If yes, the next switch is configured 422, in this example to switch to channel 102, and the process waits 424 until a notification 426 is generated alerting that the measurement has been performed. Then, circuits are switched 412 to channel 102.

After the notification 426 is generated, the process determines 428 if any additional measurements are to be made. If yes, the next measurement is configured 430, in this example, a resistance measurement, and the process waits 414 for notification 416 that channel 102 has been switched to measure the resistance of a signal on channel 102.

The process is repeated until all channels have been switched through and measured. That is, the circuits will be switched to channel 102 and a resistance measurement is taken, then the circuits will be switched to channel 103 and a current measurement is taken. The process determines 432 and 434 if additional scans are to be performed. If yes, then the initial switch is configured 408 and the initial measurement is configured 410, and each of the channels is measured again. If no, the process ends 436 and 438.

The process 400 allows for measurements, such as a voltage, resistance or current measurement, to be configured while a channel settles after being switched. That is, using the above example, during the settle time of channel 102, the digital multimeter is configured for the upcoming resistance measurement. During the settle time of channel 103, the digital multimeter is configured for the upcoming current measurement. The performance savings may be as great as the settle time of the relay. For example, a typical relay takes 5 ms per channel to close. If the required digital multimeter setup is less than 5 ms, then the configuration times may be halved, as measured in channels per second, since the digital multimeter setup can occur while the channel settles, rather than waiting until the channel to be settled to set up the digital multimeter, as done in conventional test and measurement instruments, and as shown in FIG. 2. Even if such is not the case, the parallel processes of FIGS. 3 and 4 are faster than a sequential process of FIG. 2 since overhead can be overlapped.

Although the example processes of FIGS. 3 and 4 have two paths dependent on each other using wait and notify blocks, a user may also create independent paths that run completely independently, but in parallel, as mentioned above. For example, some test and measurement instruments may have two functional measurement components, and each may be run separately in parallel, independently of the other.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Examples of the disclosure may operate on a particularly created hardware, on firmware, digital signal processors, or on a specially programmed computer including a processor operating according to programmed instructions. The terms "controller" or "processor" as used herein are intended to include microprocessors, microcomputers, ASICs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, RAM, etc. As will be appreciated by one skilled in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described regarding a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a test and measurement instrument, comprising: a port to receive a signal from a device under test; and a processor configured to, based on a parallel trigger model: execute a first process to cause first functionality of the test and measurement instrument to be performed, and execute a second process to cause second functionality of the test and measurement instrument to be performed on the signal, the second process commencing prior to a completion of the first process.

Example 2 includes the test and measurement instrument of Example 1, wherein the test and measurement instrument is a data acquisition unit including a plurality of channels, and the first process causes the data acquisition unit to switch between the plurality of channels, and the second process causes the data acquisition unit to measure characteristics of the signal.

Example 3 includes the test and measurement instrument of Example 1, wherein the test and measurement instrument is a source measure unit, and the first process causes the source measure unit to switch between a plurality of sources that are to be applied to the device under test, and the second process causes the source measure unit to measure characteristics of the signal.

Example 4 includes the test and measurement instrument of Example 1, wherein the first process causes the test and measurement instrument to perform a first type of measurement and the second process causes the test and measurement instrument to perform a second type of measurement.

Example 5 includes the test and measurement instrument of any one of Examples 1 to 4, wherein the processor is further configured to generate an error message in response to detecting that the parallel trigger model includes an overlap between the first process and the second process.

Example 6 includes the test and measurement instrument of any one of Examples 1 to 5, wherein to execute the first process and the second process, the processor is further configured, based on the parallel trigger model, to: contemporaneously configure an initial configuration for a first type of operation that is included in the first process and an initial configuration for the second type of operation that is included in the second process; execute the first type of operation in accordance with the initial configuration of the first type of operation; and execute the second type of operation in accordance with the initial configuration of the second type of operation.

Example 7 includes the test and measurement instrument of Example 6, wherein to execute the second type of operation is in response to completion of the first type of operation.

Example 8 includes the test and measurement instrument of Example 7, wherein the processor is further configured, based on the parallel trigger model, to: configure a next configuration of the first type of operation during the execution of the second type of operation in accordance with the initial configuration; and in response to completion of the second type of operation, perform the first type of operation in accordance with the next configuration.

Example 9 includes the test and measurement instrument of any one of Examples 1 to 8, wherein the parallel trigger model defines a first sequence of procedures associated with the first process and a second sequence of procedures associated with the second process.

Example 10 includes the test and measurement instrument of any one of Examples 1 to 9, wherein the parallel trigger model causes the processor to execute the first process and the second process independently of one another.

Example 11 includes the test and measurement instrument of any one of Examples 1 to 9, wherein the parallel trigger model coordinates procedures within the first process with procedures within the second.

Example 12 is a method for performing first and second functionality of a test and measurement instrument, the method comprising: receiving a parallel trigger model; receiving a signal from a device under test; and based on the parallel trigger model, performing a first process associated with first functionality of a test and measurement instrument from a start time to an end time; and based on the parallel trigger model, performing a second process, associated with second functionality of the test and measurement instrument, on the signal, the second process beginning prior to the end time of the first process.

Example 13 includes the method of Example 12, wherein the first process is switching circuits of the test and measurement instrument and the second process is measuring a characteristic of the signal.

Example 14 includes the method of any one of Examples 12 or 13, wherein the first process and the second process are performed independently.

Example 15 includes the method of any one of Examples 12 or 13, wherein the first process and the second process are performed with one or more dependencies.

Example 16 includes the method of any one of Examples 12, 14, or 15, wherein the first process is a first type of measurement and the second process is a second type of measurement.

Example 17 is a computer readable storage medium having instructions stored thereon that, when executed by a processor of a test and measurement instrument, cause the test and measurement instrument to: configure a first set of components associated with first functionality of the test and measurement instrument to perform a first type of operation based on a parallel trigger model; configure, concurrently with the configuration of the first set of components, a second set of components associated with second functionality of the test and measurement instrument to perform a second type of operation based on the parallel trigger model; and perform the first type of operation and the second type of operation in concert based on the parallel trigger model.

Example 18 includes the computer readable storage medium of Example 17, wherein the first type of operation is switching circuits of the test and measurement instrument and the second type of operation is measuring a characteristic of the signal.

Example 19 includes the computer readable storage medium of any one of Examples 17 or 18, wherein the first type of operation and the second type of operation are configured and performed independently.

Example 20 includes the computer readable storage medium of any one of Examples 17 or 18, wherein the first type of operation and the second type of operation are configured and performed dependently.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement instrument, comprising:
   a port to receive a signal from a device under test;
   an input configured to receive a parallel trigger model, the parallel trigger model including a procedure for performing a first process and a second process in parallel; and
   a processor configured to, based on the parallel trigger model:
      detect whether the parallel trigger model includes an overlap between the first process and the second process,
      generate an error message in response to detecting the overlap,
      when the overlap is not detected, execute the first process to cause a first functionality of the test and measurement instrument to be performed, and
      when the overlap is not detected, execute the second process to cause a second functionality of the test and measurement instrument to be performed on the signal, the second process commencing prior to a completion of the first process.

2. The test and measurement instrument of claim 1, wherein the test and measurement instrument is a data acquisition unit including a plurality of channels, and the first process causes the data acquisition unit to switch between the plurality of channels, and the second process causes the data acquisition unit to measure characteristics of the signal.

3. The test and measurement instrument of claim 1, wherein the test and measurement instrument is a source measure unit, and the first process causes the source measure unit to switch between a plurality of sources that are to be applied to the device under test, and the second process causes the source measure unit to measure characteristics of the signal.

4. The test and measurement instrument of claim 1, wherein the first process causes the test and measurement instrument to perform a first type of measurement and the second process causes the test and measurement instrument to perform a second type of measurement.

5. The test and measurement instrument of claim 1, wherein to execute the first process and the second process, the processor is further configured, based on the parallel trigger model, to:
contemporaneously configure an initial configuration for a first type of operation that is included in the first process and an initial configuration for the second type of operation that is included in the second process;
execute the first type of operation in accordance with the initial configuration of the first type of operation; and
execute the second type of operation in accordance with the initial configuration of the second type of operation.

6. The test and measurement instrument of claim 5, wherein to execute the second type of operation is in response to completion of the first type of operation.

7. The test and measurement instrument of claim 6, wherein the processor is further configured, based on the parallel trigger model, to:
configure a next configuration of the first type of operation during the execution of the second type of operation in accordance with the initial configuration; and
in response to completion of the second type of operation, perform the first type of operation in accordance with the next configuration.

8. The test and measurement instrument of claim 1, wherein the parallel trigger model defines a first sequence of procedures associated with the first process and a second sequence of procedures associated with the second process.

9. The test and measurement instrument of claim 1, wherein the parallel trigger model causes the processor to execute the first process and the second process independently of one another.

10. The test and measurement instrument of claim 1, wherein the parallel trigger model coordinates procedures within the first process with procedures within the second.

11. A method for performing first and second functionality of a test and measurement instrument, the method comprising:
receiving a parallel trigger model including a procedure for performing a first process and a second process in parallel;
detecting whether the parallel trigger model includes an overlap between the first process and the second process,
generating an error message in response to detecting the overlap,
receiving a signal from a device under test;
when the overlap is not detected, based on the parallel trigger model, performing a first process associated with a first functionality, from a start time to an end time; and
when the overlap is not detected, based on the parallel trigger model, performing a second process, associated with a second functionality, on the signal, the second process beginning prior to the end time of the first process.

12. The method of claim 11, wherein the first process is switching circuits of the test and measurement instrument and the second process is measuring a characteristic of the signal.

13. The method of claim 11, wherein the first process and the second process performed independently.

14. The method of claim 11, wherein the first process and the second process are performed with one or more dependencies.

15. The method of claim 11, wherein the first process is a first type of measurement and the second process is a second type of measurement.

16. A non-transitory computer readable storage medium having instructions stored thereon that, when executed by a processor of a test and measurement instrument, cause the test and measurement instrument to:
receive a parallel trigger model including a procedure for performing a first type of operation and a second type of operation in concert;
detect whether the parallel trigger model includes an overlap between the first process and the second process;
generate an error message in response to detecting the overlap;
when the overlap is not detected, configure a first set of components associated with a first functionality of the test and measurement instrument to perform a first type of operation based on the parallel trigger model;
when the overlap is not detected, configure, concurrently with the configuration of the first set of components, a second set of components associated with a second functionality of the test and measurement instrument to perform the second type of operation based on the parallel trigger model; and
perform the first type of operation and the second type of operation in concert based on the parallel trigger model.

17. The non-transitory computer readable storage medium of claim 16, wherein the first type of operation is switching circuits of the test and measurement instrument and the second type of operation is measuring a characteristic of the signal.

18. The non-transitory computer readable storage medium of claim 16, wherein the first type of operation and the second type of operation are configured and performed independently.

19. The non-transitory computer readable storage medium of claim 16, wherein the first type of operation and the second type of operation are configured and performed dependently.

* * * * *